United States Patent
Doubrava et al.

(10) Patent No.: US 9,581,675 B2
(45) Date of Patent: Feb. 28, 2017

(54) VIRTUAL MODEL ADAPTER REMOVAL AND SUBSTITUTION TECHNIQUE FOR CASCADED NETWORKS

(71) Applicant: Tektronix, Inc., Beaverton, OR (US)

(72) Inventors: Laudie J. Doubrava, Tigard, OR (US); Josiah A. Bartlett, Forest Grove, OR (US)

(73) Assignee: TEKTRONIX, Inc., Beaverton, OR (US)

( * ) Notice: Subject to any disclaimer, the term of this patent is extended or adjusted under 35 U.S.C. 154(b) by 797 days.

(21) Appl. No.: 13/773,253

(22) Filed: Feb. 21, 2013

(65) Prior Publication Data

US 2014/0058693 A1    Feb. 27, 2014

Related U.S. Application Data

(60) Provisional application No. 61/693,229, filed on Aug. 24, 2012.

(51) Int. Cl.
*G01R 35/00* (2006.01)
*G01R 31/319* (2006.01)

(52) U.S. Cl.
CPC ....... *G01R 35/005* (2013.01); *G01R 31/3191* (2013.01)

(58) Field of Classification Search
CPC ... G01R 31/3191; G01R 35/005; G01R 27/28
USPC ........ 702/62, 85, 91, 117; 324/601; 375/224
See application file for complete search history.

(56) References Cited

U.S. PATENT DOCUMENTS

| | | | |
|---|---|---|---|
| 6,650,123 B2 | 11/2003 | Martens | |
| 6,785,625 B1 | 8/2004 | Fan et al. | |
| 6,823,276 B2 | 11/2004 | Blackham et al. | |
| 7,627,028 B1 * | 12/2009 | Frei | G01R 27/28 375/224 |

OTHER PUBLICATIONS

Agilent Technologies, "Advanced Calibration Techniques for Vector Network Analyzers," Modern Measurement Techniques for Testing Advanced Military Communications and Radars, 2nd Edition, 2006, 86 pages.

Hoffman, Johannes, "Traceable S-Parameter Measurements in Coaxial Transmission Lines Up to 70ghz," a dissertation submitted to the Swiss Federal Institute of Technology Zurich for the degree of Doctor of Sciences, 2009.

Zhang, Sulan, "High Attenuation Measurement of Step Attenuators," Agilent Technologies, 2012, 9 pages.

* cited by examiner

*Primary Examiner* — John H Le
(74) *Attorney, Agent, or Firm* — Marger Johnson; William K. Bucher

(57) ABSTRACT

System and methods may allow an operator of a signal measurement instrument to characterize and calibrate a network with unsupported connector types, e.g., not traceable to known standards. Adapters having supported and unsupported interfaces can be used to measure the system responses of networks in a system under test. These measurements can be mathematically cascaded to deduce virtual models that produce an accurate and fully calibrated total system response.

19 Claims, 9 Drawing Sheets

VIRTUAL MODEL ADAPTER REMOVAL AND SUBSTITUTION TECHNIQUE FOR CASCADED NETWORKS

CROSS-REFERENCE TO RELATED APPLICATION

The present application claims the benefit of U.S. Provisional Patent Application No. 61/693,229, titled "Virtual Model Adapter Removal and Substitution Technique for Cascaded Networks" and filed on Aug. 24, 2012, the content of which is hereby fully incorporated by reference herein.

BACKGROUND

Test instruments used to measure the behavior of signals in electrical systems must be calibrated in order to gather accurate measurements. For signal processing, a typical measurement apparatus is made up of a scope, a probe module, and a probe tip. Calibration of this apparatus is accomplished by characterizing the each of these individual components and the interfaces between them. These components and their interfaces are mathematically modeled as elements of an electrical network.

Characterization requires that measurements of these components be traceable to known calibration standards. Commercially available calibration kits contain several standards for a given connector and the type of the networks to be measured. However, calibration kits are not commercially available for every connector type.

Components emerging onto the market might not be measurable using standard calibration techniques because their connector types are unsupported. Calibration kits necessary to support these connector types do not exist commercially. Measurements taken with unsupported connectors are not traceable to known calibration standards, which makes them difficult to characterize.

U.S. Pat. No. 6,823,276, issued to Blackham, et al., discloses a system and method for determining measurement errors of a testing device. A vector network analyzer (VNA) is used to measure the three systematic errors related to one-port calibration: directivity, reflection tracking, and source match. Even though standards for these three types of systematic errors are known, they may not be suitable over the entire frequency range of interest. Blackham, thus, assigns weights to standards that are more trustworthy in a particular range of frequency. These weights are applied to a least-squares calculation, resulting in a characterization of an element in a network.

U.S. Pat. No. 6,650,123, issued to Martens, discloses methods for determining characteristics of interface devices used with vector network analyzers. Martens treats a multi-port adapter or test fixture as one entity, rather than as multiple two-port networks treated one two-port network at a time. Two calibrations are performed, one at an inner reflection plane and one at an outer reflection plane.

Accordingly, there is need for a system and method that allows an operator of a signal measurement instrument to characterize and calibrate a network with unsupported connector types, not traceable to known calibration standards.

SUMMARY

Embodiments of the disclosed technology generally allow an operator of a signal measurement instrument to characterize and calibrate a network with unsupported connector types, e.g., not traceable to known standards.

In an embodiment, a signal measurement instrument is coupled to a first network and a second network. The first and second networks are coupled to a first adapter. The path through the instrument, first network, first adapter, second network, and back to the instrument is measured according to a first system response to yield a first characterization.

In another embodiment, the instrument is, then, coupled to a third network and a fourth network. The third and fourth networks are coupled to a second adapter. The path through the instrument, the third network, second adapter, fourth network, and back to the instrument are measured according to a second system response to yield a second characterization.

According to another embodiment, the instrument is, then, coupled to the first network and the fourth network. The first network is coupled to the first adapter, the first adapter is coupled to the second adapter, and the second adapter is coupled to the fourth network. The path through the instrument, the first network, the first adapter, the second adapter, the fourth network, and back to the instrument is measuring according to a third system response to yield a third characterization.

According to yet another embodiment, a fourth characterization of the first adapter is removed, as is a fifth characterization of the second adapter from the first, second, and third characterizations. The result yields a sixth characterization of a combined second network and third network. The interface between the second and third network, which is unsupported by calibration kits and not traceable to known standards, is calibrated for interpretation of signals transmitted across the unsupported interface.

DETAILED DESCRIPTION

Figure 1:
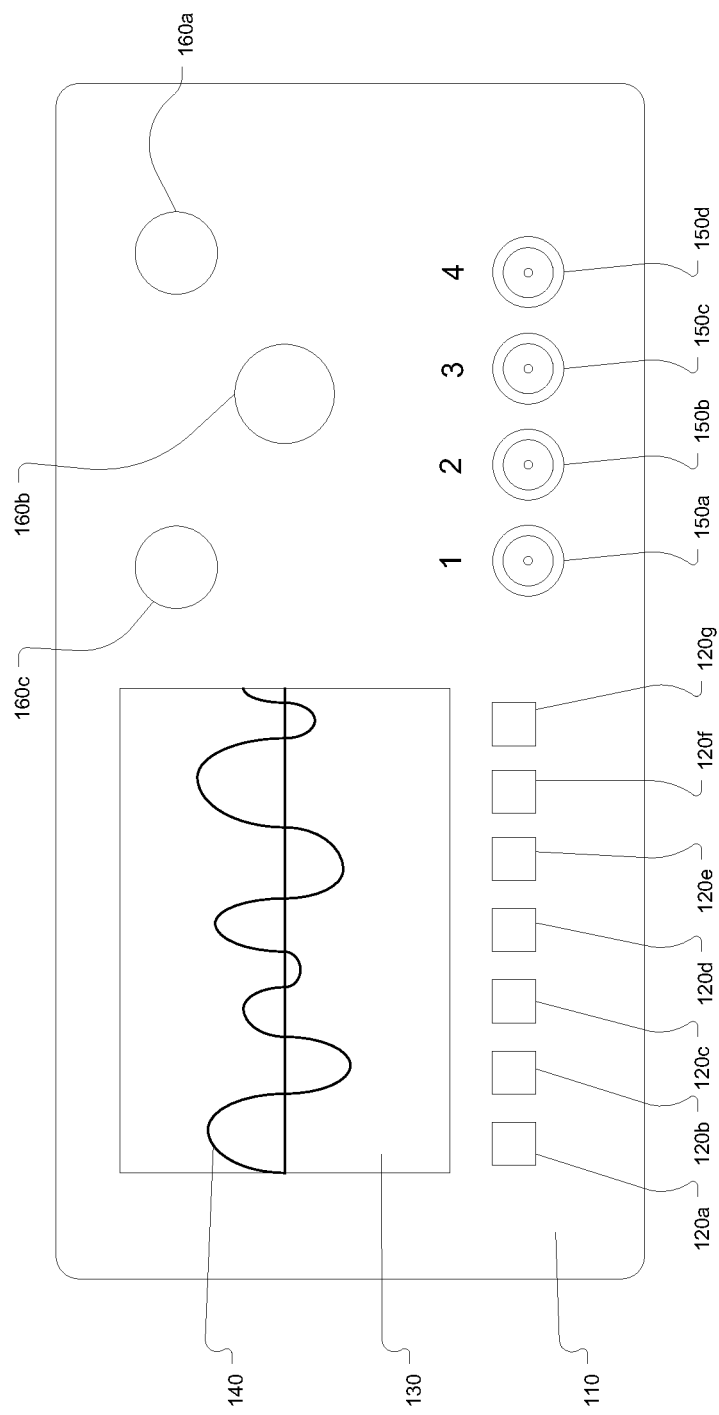
FIG. 1 illustrates a front perspective view of an exemplary signal measurement instrument.

FIG. 1 illustrates a front perspective view of an exemplary signal measurement instrument 110. In some embodiments, this may be a stand-alone vector network analyzer (VNA), or in other embodiments, it may be an oscilloscope loaded with software capable of performing the functions of a VNA. Located on the instrument are a display 130, input buttons 120a-g, signal channels 150a-d, and input dials 160a-c. Input buttons 120a-g allow an operator of instrument 110 to interact with the display and alter the manner in which a signal 140 is measured. Similarly, input dials 160a-c allow an operator to interact with the device.

Figure 2:
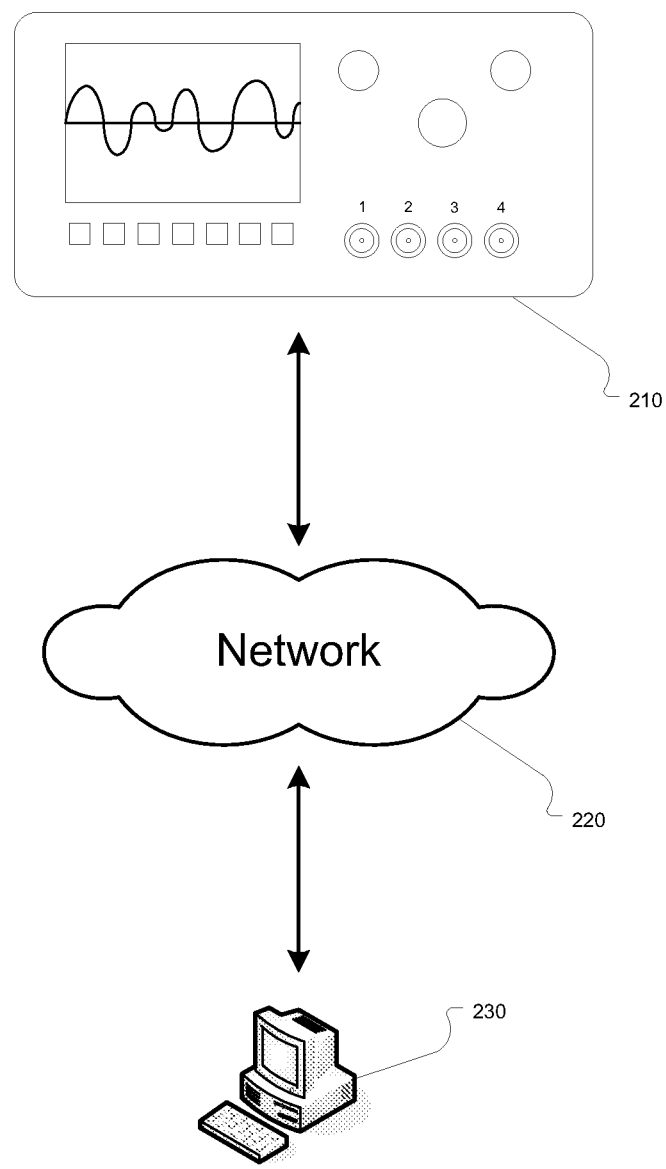
FIG. 2 illustrates an example in which the signal measurement instrument of FIG. 1 is connected to a computer over a network.

With reference to the example illustrated by FIG. 2, the instrument 210 may also possess a network interface (not shown) connected to a network 220. In some embodiments, network 220 may be a local-area network (LAN), or it may be a wide-area network (WAN). A computer 230 similarly connected to network 220 may communicate with the instrument 210 over the network 220. An operator of the instrument 210 may interact with it through the input devices 120a-g and 160a-c of FIG. 1, or he may interact with it through a computer 220 in communication with the instrument 210.

With reference to the example illustrated by FIG. 2, the instrument 210 may also possess a network interface (not shown) connected to a network 220. In some embodiments, network 220 may be a local-area network (LAN), or it may be a wide-area network (WAN). A computer 230 similarly connected to network 220 may communicate with the instrument 210 over the network 220. An operator of the instrument 210 may interact with it through the input devices 120a-g and 160a-c of FIG. 1, or he may interact with it through a computer 220 in communication with the instrument 210.

Figure 3:
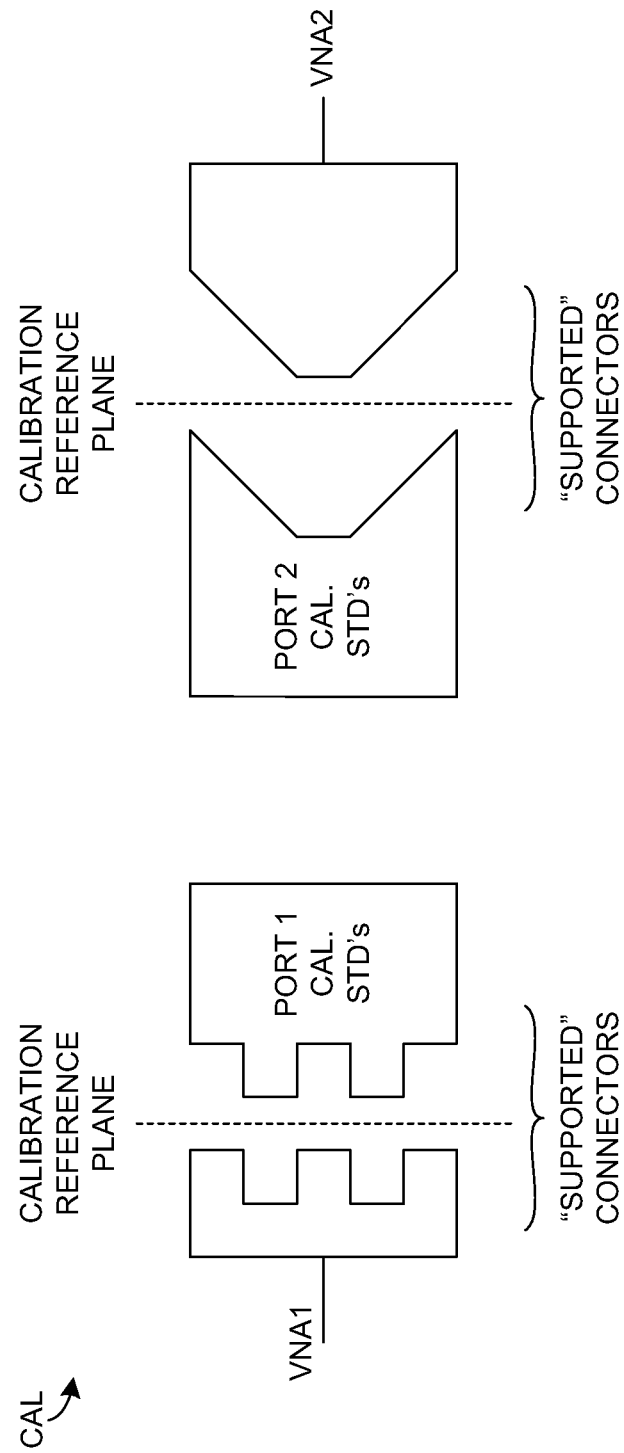
FIG. 3 illustrates the calibration of a signal instrument using known traceable standards thus establishing Calibration Reference Planes for characterizing devices with supported connectors.

FIG. 3 illustrates an example CAL in which two exemplary sets of traceable calibration standards, with supported connectors, are coupled to the signal instrument to establish the measurement Calibration Reference Planes.

Figure 4:
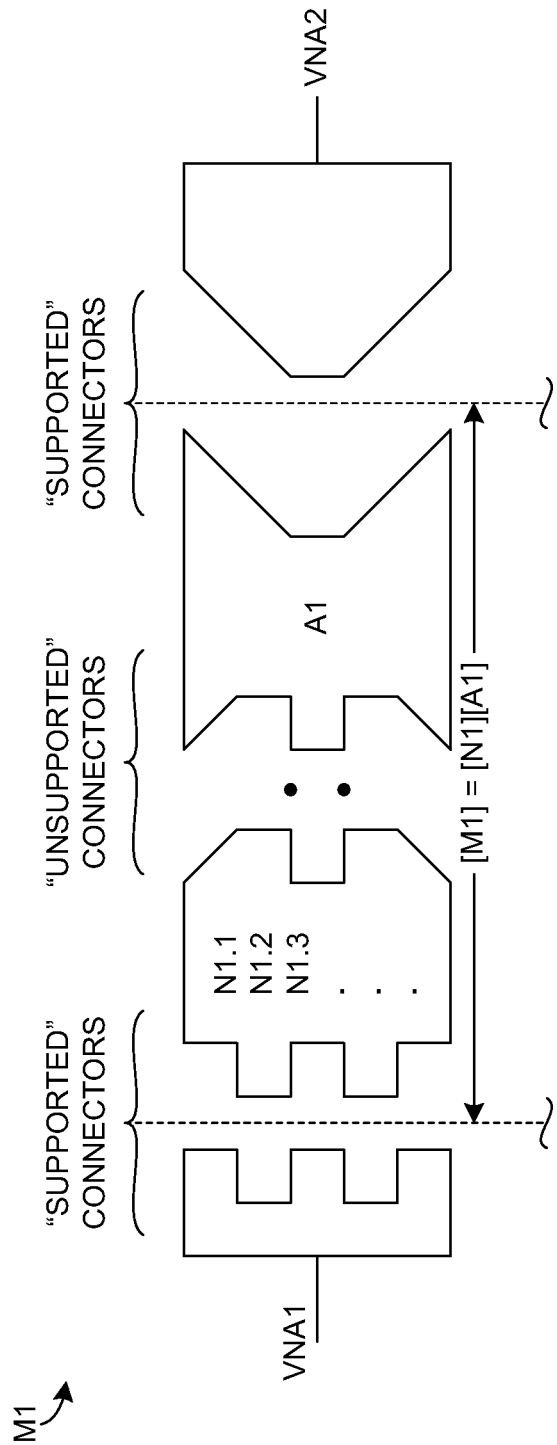
FIG. 4 illustrates a first example of a calibrated measurement of a network with an unsupported connector using an adapter.

FIG. 4 illustrates a first example M1 of measuring a network [N1] with an unsupported connector using an adapter [A1] where:

[M1]=[N1]: [A1] Network [N1] measurement using Adapter [A1].

Figure 5:
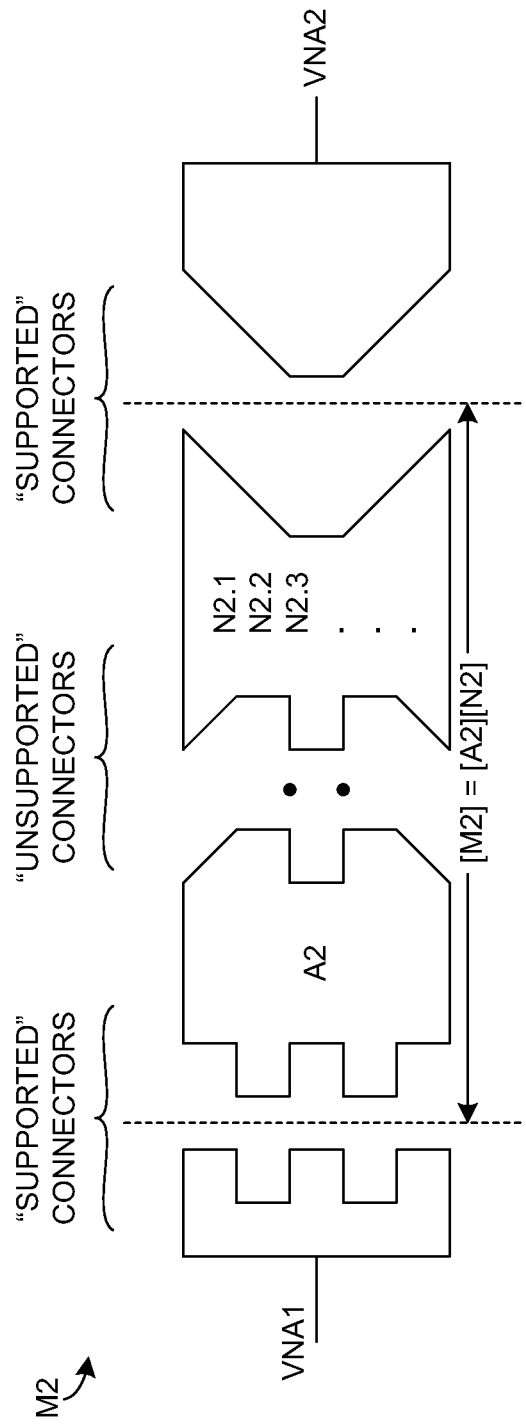
FIG. 5 illustrates a second example of measuring a network with an unsupported connector using an adapter.

FIG. 5 illustrates a second example M2 of measuring a network [N2] with an unsupported connector using an adapter [A2] where:

[M2]=[A2]:[N2] Network [N2] measurement using Adapter [A2].

Figure 6:
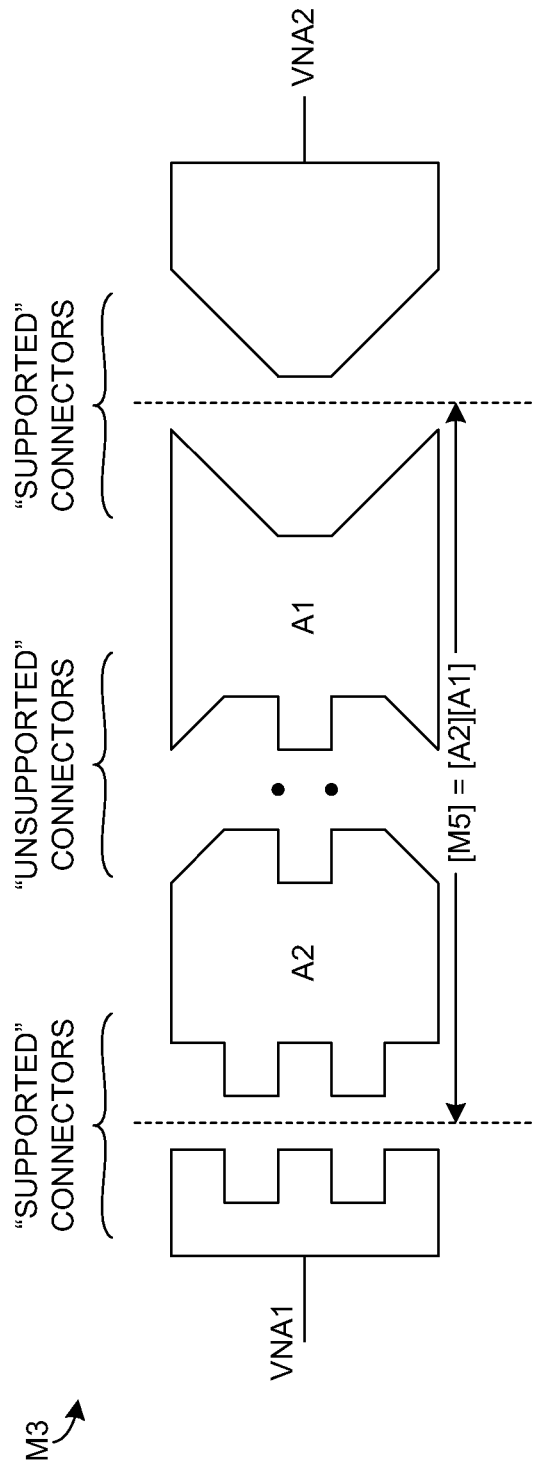
FIG. 6 illustrates an example of measuring two adapters connected back-to-back.

FIG. 6 illustrates an example M3 of measuring two adapters [A2] and [A1] connected back-to-back where:

[M5]=[A2]:[A1] Back-to-back adapter-pair measurement.

Figure 7:
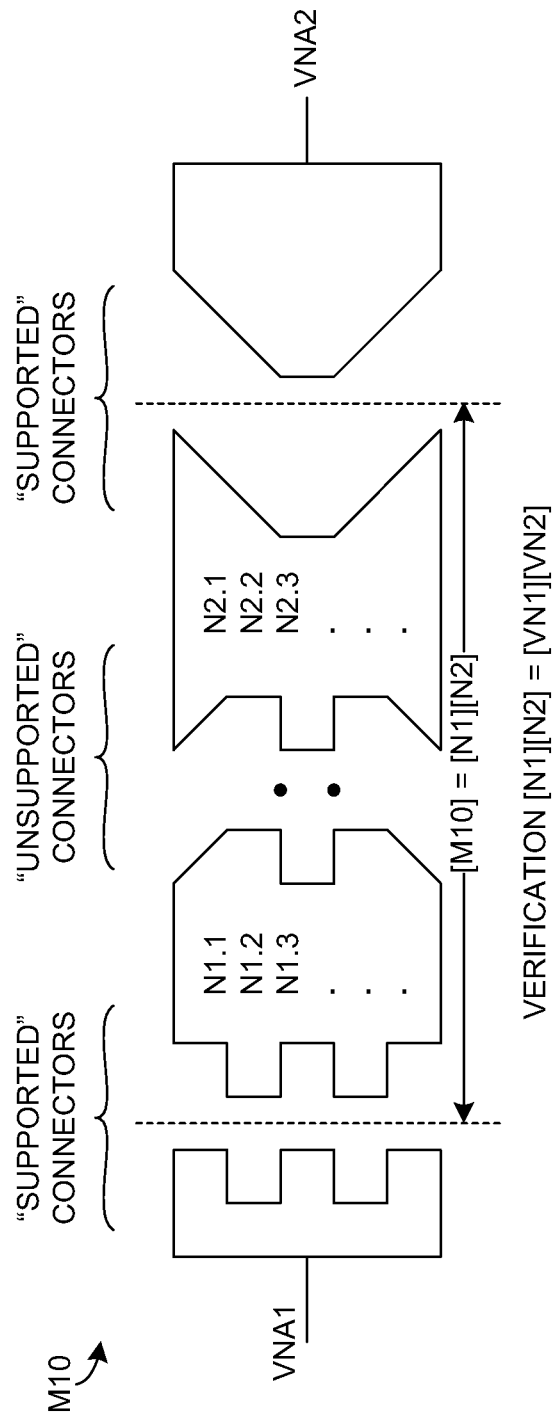
FIG. 7 illustrates an example of a verification of a total system measurement.

FIG. 7 illustrates an example M10 of a verification of a total system measurement [NT1] where:

[M10]=[N1]:[N2] Total system measurement.

With regard to the virtual model matrix math used herein, certain blocks (e.g., [M1], [M2], and [M10]) generally represent sets of measured data (e.g., s-parameters), other blocks (e.g., [N1] and [N2]) generally represent network characteristics (e.g., s-parameters), and other blocks (e.g., [A1] and [A2]) generally represent adapter characteristics (e.g., s-parameters). A notation such as [N3]=[N1][N2] generally indicates that networks [N1] and [N2] are cascaded (or embedded) to create network [N3]. A notation such as [N3]=[N1]:[N2] generally indicates that networks [N1] and [N2] are cascaded (or embedded) with unsupported connectors. A notation such as [N2]=[N1]$^{-1}$[N3] generally indicates that network [N1] is being de-embedded) from network [N3] to solve for the network [N2] data set.

Blocks such as those described above may be represented by sets of multiport s-parameters or other parameter sets such as ABCD-parameters. In general, parameters such as s-parameters cannot be cascaded by way of direct matrix multiplication; rather, certain matrix transformations must generally be applied to the s-parameter (or other) data in order to apply standard matrix math techniques thereto for cascading data blocks of s-parameters. Cascading, embedding, and de-embedding networks of s-parameters (or other parameters) generally requires that the parameters of the individual networks be transformed to the appropriate parameter set (e.g., t-parameters) before and after matrix multiplication and/or inversion.

When mathematically cascaded, individually characterized networks, e.g., [N1] and [N2], generate the total system response [NT]: [N1] [N2]=[NT]. When the interface between networks is unsupported, individual networks must be measured using adapters. Adapters (A1 and A2) permit connection to a measurement system with supported connectors providing measurements that are traceable to known calibration standards. However, directly cascading networks measured with adapters results in an incorrect total system response: [N1][A1] [A2][N2]≠[NT].

A virtual network model, according to embodiments of the disclosed technology, will mathematically remove the effects of the adapters used during measurement and characterization of the networks. Cascading a pair (or more) of virtual network (VN) models result in the correct total system response: [VN1] [VN2]=[NT].

Generating virtual network models as described herein generally begins with an identification of the individual network components to be characterized in the cascaded network. Consider the following example:

[NT]=[N1]:[N2] Cascaded Network (Total Network) where the individual network components to be characterized are as follows:

[N1] Network [N1]
[N2] Network [N2]
: Unsupported connector interface

A calibrated measurement of each individual network may be made and appropriate adapters may be added where necessary to present a "supported" connector interface for the measuring instrument. These become the augmented network measurements. Consider the following example:

[M1]=[N1]:[A1] Measurement of [N1] Augmented Network
[M2]=[A2]:[N2] Measurement of [N2] Augmented Network
Where: [A1] Adapter 1
[A2] Adapter 2

A first trial of cascading the augmented networks generally includes cascading the individual augmented networks directly:

[NT]≠[M1] [M2]
[NT]≠[N1]:[A1] [A2]:[N2]

Mathematically cascading the Augmented Networks with the added adapters does not create the correct Total Network, [NT].

The Deembedding Network, that when inserted between the Augmented Networks, will cancel the effects of the adapters and generate the correct total cascaded network [NT] may then be identified. For example, cascading the individual augmented networks with deembedding networks [A1]$^{-1}$ and [A2]$^{-1}$ results in the following:

[NT]=[N1]:[A1] [A1]$^{-1}$[A2]$^{-1}$ [A2]:[N2]
[NT]=[N1]::[N2]:
[NT]=[N1]:[N2]

Back-to-back measurements of the adapters used during the original augmented network measurements provides the necessary data needed for the deembedding networks:

[M5]=[A2]:[A1]  and  [M5]$^{-1}$=[[A2]:[A1]]$^{-1}$=[A1]$^{-1}$[A2]$^{-1}$

In virtual model partitioning, the virtual network model may incorporate the adapter-pair measurement [M5] into the augmented network measurements, e.g., by absorbing the inverse adapter-pair measurements, $[M5]^{-1}$ into one or more of the augmented networks measurements to generate the virtual network models [VN1] and [VN2]:

[NT]=[N1]:[A1] $[A1]^{-1}[A2]^{-1}$ [A2]:[N2]
[NT]=[M1] $[M5]^-$ [M2]

The above represents Network measurements needed to characterize the Total Network.

Consider a first partition choice:
[NT]=[M1] $[M5]^{-1}$ [M2]
[NT]=[VN1] [VN2]

Here, both of the adapter-pair measurement $[M5]^{-1}$ is associated with the augmented network [M2], generating the virtual network model [VN2]=$[M5]^{-1}$ [M2].

A couple of observations are evident from virtual models [VN1] and [VN2]. First, virtual model [VN1] is equivalent to measurement [M1]. Second, virtual model [VN2] is equal to measurement $[M5]^{-1}$ cascaded with measurement [M2]. Third, [VN1] is not equal to [N1] and [VN2] is not equal to [N2]. Nonetheless, [VN1][VN2]=[N1]:[N2] where:

[VN1]=[N1]:[A1]
[VN2]=$[M5]^{-1}$ [M2]
[VN2]=$[A1]^{-1}$ $[A1]^{-1}$ [A2]:[N2]
[VN2]=$[A1]^{-1}$: [N2]

Therefore:
[VN1][VN2]=[N1]:[A1] $[A1]^{-1}$:[N2]
[VN1][VN2]=[N1]:[N2]
[VN1][VN2]=[NT]

Here, the cascaded virtual network models [VN1][VN2] generate the total network [NT].

Consider a second partition choice:
[NT]=[M1]$[M5]^{-1}$ [M2]
[NT]=[N1]:[A1]$[M5]^{-1}$ [A2]:[N2]
[NT]=[VN5] [VN6]

For this partition choice, the adapter-pair measurement [M5] is associated with the augmented network [M1]=[N1]:[A1] generating the Virtual Network Model [VN5] where:

[VN5]=[M1]$[M5]^{-1}$
[VN5]=[N1]:[A1]$[A1]^{-1}[A2]^{-1}$=[N1]$[A2]^{-1}$
[VN6]=[M2]
[VN6]=[A2]:[N2]
[VN5][VN6]=[M1]$[M5]^{-1}$ [M2]
[VN5][VN6]=[N1]:$[A2]^{-1}$ [A2]:[N2]
[VN5][VN6]=[N1]:[N2]
[VN5][VN6]=[NT]

Here, the cascaded virtual network models [VN5][VN6] generate the total network [NT].

Regardless of the partitioning method used, the Augmented network measurements may be cascaded with the inverse of the adapter-pair measurement, $[M5]^{-1}$ to obtain the total system response, [NT]:

[N1]:[N2]=[M1] [M5]-1 [M2]
[N1]:[N2]=[N1]:[A1][A1]-1[A2]-1[A2]:[N2]
[N1]:[N2]=[VN1][VN2]
[N1]:[N2]=[VN5][VN6]

The effects of the adapters used to measure the individual networks are removed with the inverse adapter-pair measurement, $[M5]^{-1}$ during the cascade operation with the augmented network measurements [M1] and [M2]. This is advantageous for a number of reasons. For example, characterization of the individual adapters is unnecessary and potentially impossible, measurements at unsupported connectors are unnecessary, and all measurements are made at supported connectors and traceable to known standards.

Several advantages are realized with virtual models. Adapter-pair measurement [M5] no longer needs to be retained separately. That is, the adapter-pair measurement is incorporated into the virtual models. By themselves, the cascading of virtual models returns the correct total system response. Additionally, virtual networks are characterized to known calibration standards using standard, commercially available calibration kits. In sum, the virtual model technique effectively applies adapter removal to the original network measurements to allow seamless joining of cascaded virtual network models at unsupported interfaces.

Virtual models are not limited to just a pair of networks. Multiple networks in a chain, with multiple unsupported interfaces, can be individually measured (using appropriate adapters) and converted to virtual models. Mathematically cascading the derived virtual network models, again, returns the correct total network response. Consider the following example with 3 Networks:

[NT]=[N1]:[N2]:[N3] Cascaded Network (Total Network) where the individual network components to be characterized are as follows:

[N1] ProbeTip
[N2] Probe Module
[N3] Oscilloscope
: Unsupported connector interface A calibrated measurement of each individual network may be made and appropriate adapters may be added where necessary to present a "supported" connector interface for the measuring instrument. These become the augmented network measurements. Consider the following example:

[M1]=[N1]:[A1] Measurement of [N1] Augmented Network
[M3]=[A2]:[N2]:[A3] Measurement of [N2] Augmented Network
[M4]=[A4]:[N3] Measurement of [N3] Augmented Network where:

[A1] Adapter 1
[A2] Adapter 2
[A3] Adapter 3
[A4] Adapter 4

A first trial of cascading the augmented networks generally includes cascading the individual augmented networks directly:

[NT]≠[M1] [M3] [M4]
[NT]≠[N1]:[A1] [A2]:[N2]:[A3] [A4]:[N3]

Mathematically cascading the Augmented Networks (with added adapters) does not create the correct Total Network, [NT].

The Deembedding Networks, that when inserted between the Augmented Networks, will cancel the effects of the adapters and generate the correct total cascaded network [NT] may then be determined. For example, cascading the individual augmented networks with deembedding networks $[A1]^{-1}$, $[A2]^{-1}$, $[A3]^{-1}$, and $[A4]^{-1}$ results in the following:

[NT]=[N1]:[A1] $[A1]^{-1}[A2]^{-1}$ [A2]:[N2]:[A3] $[A3]^{-1}$ $[A4]^{-1}$ [A4]:[N3]
[NT]=[N1]::[N2]::[N3]
[NT]=[N1]:[N2]:[N3]

Back-to-back measurements of the adapters used during the original augmented network measurements provides the necessary data needed for the deembedding networks:

[M5]=[A2]:[A1]   and   $[M5]^{-1}$=$[[A2]:[A1]]^{-1}$=$[A1]^{-1}[A2]^{-1}$
[M6]=[A4]:[A3]   and   $[M6]^{-1}$=$[[A4]:[A3]]^{-1}$=$[A3]^{-1}[A4]^{-1}$ In virtual model partitioning, the virtual network model may incorporate the adapter-pair measurements [M5] and

[M6] into the augmented network measurements, e.g., by absorbing the inverse adapter-pair measurements, $[M5]^{-1}$ and $[M6]^{-1}$ into one or more of the augmented networks measurements to generate the virtual network models [VN1], [VN3] and [VN4]:

[NT]=[N1]:[A1] $[A1]^{-1}[A2]^{-1}$ [A2]:[N2]:[A3] $[A3]^{-1}$ $[A4]^{-1}$ [A4]:[N3]

[NT]=[M1] $[M5]^{-1}$ [M3] $[M6]^{-1}$ [M4]

The above represents Network measurements needed to characterize the Total Network.

Consider a first partition choice:

[NT]=[M1] $[M5]^{-1}$[M3][M6]$^{-1}$ [M4]

[NT]=[VN1] [VN3] [VN4]

Here, both of the adapter-pair measurements $[M5]^{-1}$ and $[M6]^{-1}$ are associated with the augmented network [M3]=[A2]:[N2]:[A3], generating the virtual network model [VN3]=$[M5]^{-1}$[M3][M6]$^{-1}$ where: [VN1]=[N1]:[A1]

[VN3]=$[M5]^{-1}$ [M3] [M6]$^{-1}$

[VN3]=$[A1]^{-1}[A2]^{-1}$ [A2]:[N2]:[A3] $[A3]^{-1}[A4]^{-1}$

[VN3]=$[A1]^{-1}$:[N2]:$[A4]^{-1}$

[VN4]=[A4]:[N3]

Therefore:

[VN1][VN3][VN4]=[N1]:[A1] $[A1]^{-1}$:[N2]:$[A4]^{-1}$ [A4]:[N3]

[VN1][VN3][VN4]=[N1]:[N2]:[N3]

[VN1][VN3][VN4]=[NT]

Here, the cascaded virtual network models [VN1][VN3][VN4] generate the total network [NT].

Consider a second partition choice:

[NT]=[M1][M5]$^{-1}$ [M3] [M6]$^{-1}$[M4]

[NT]=[N1]:[A1][M5]$^{-1}$ [A2]:[N2]:[A3] [M6]$^{-1}$[A4]:[N3]

[NT]=[N1]:$[A2]^{-1}$ [A2]:[N2]:[A3] $[A3]^{-1}$:[N3]

[NT]=[VN5] [VN7] [VN8]

For this partition choice, the adapter-pair measurement [M5] is associated with the augmented network [M1]=[N1]:[A1] and the adapter-pair measurement [M6] is associated with the augmented network [M4]=[A4]:[N3] where:

[VN5]=[M1][M5]$^{-1}$

[VN5]=[N1]:[A1] $[A1]^{-1}[A2]^{-1}$=[N1]: $[A2]^{-1}$

[VN7]=[M3]

[VN7]=[A2]:[N2]:[A3]

[VN8]=[M6]$^{-1}$[M4]

[VN8]=$[A3]^{-1}$ $[A4]^{-1}$ [A4]:[N3]=$[A3]^{-1}$: [N3]

[VN5][VN7][VN8]=[M1][M5]$^{-1}$ [M3] $[A6]^{-1}$:[M4]

[VN5][VN7][VN8]=[N1]:$[A2]^{-1}$ [A2]:[N2]:[A3] $[A3]^{-1}$:[N3]

[VN5][VN7][VN8]=[N1]:[N2]:[N3]

[VN5][VN7][VN8]=[NT]

Here, the cascaded virtual network models [VN5][VN7][VN8] generate the total network [NT].

Regardless of the partitioning method used, the Augmented network measurements may be cascaded with the inverse of the adapter-pair measurement, $[M5]_{-1}$, and $[M6]^{-}$$_1$, to obtain the total system response, [NT]:

[N1]:[N2]:[N3]=[M1] $[M5]^{-1}$ [M3] $[M6]^{-1}$ [M4]

[N1]:[N2]:[N3]=[N1]:[A1]$[A1]^{-1}[A2]^{-1}$[A2]:[N2]:[A3] $[A3]^{-1}[A4]^{-1}$ [A4]:[N3]

[N1]:[N2]:[N3]=[VN1][VN3][VN4]

[N1]:[N2]:[N3]=[VN5][VN7][VN8]

The effects of the adapters used to measure the individual networks are removed with the inverse adapter-pair measurement, $[M5]^{-1}$ and $[M6]^{-1}$ during the cascade operation with the network measurements [M1], [M3] and [M4].

Figure 8:
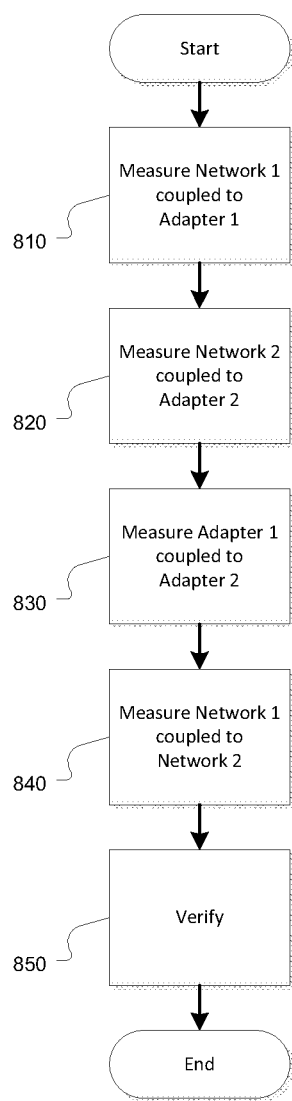
FIG. 8 is a control-flow diagram illustrating an exemplary calibration process using the signal measurement instrument of FIG. 1 and connectors and adapters such as those illustrated in FIGS. 3-6.

FIG. 8 is a control-flow diagram illustrating an exemplary calibration and characterization process using the signal measurement instrument of FIG. 1 and connectors and adapters such as those illustrated in FIGS. 3-6. A first measurement 810 (e.g., of Network1) is made with a first adapter that has both a supported connector interface and an unsupported interface that mates with the unsupported connector of Network1. A second measurement 820 (e.g., of Network2) is made with a second adapter that also has both a supported and unsupported interface that mates with the unsupported connector of Network1. A third measurement 830 is made with both adapters coupled to one another through the unsupported interface. The characteristics of the adapters are removed from the total system response by taking an inverse of the third measurement in a mathematical cascade. The network is measured 840 without either of the adapters, and the measurement is verified 850 against the results of the cascade.

Figure 9:
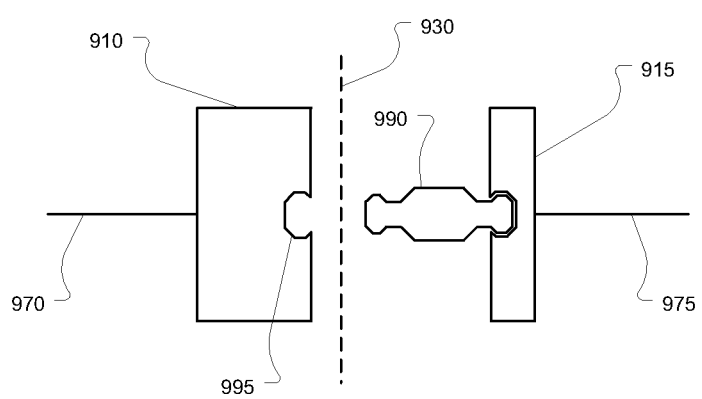
FIG. 9 illustrates an example of measuring a network using an adapter with an unsupported connector.

In other embodiments, the virtual network model also works well accommodating unsupported interfaces utilizing interconnect "bullets." Bullets, like the family of Cristek® SMPM Interconnects, are modeled with adapters in a manner similar to that described above. FIG. 9 illustrates a pair of unsupported interfaces 930 and connectors 910 and 915 coupled across the interface 930 with a bullet 990, which is received by a bullet receiver 995. Interface 930 is unsupported by commercially available calibration kits and is not traceable to known standards. Connector 910 is coupled to the instrument 110 [of FIG. 1] by way of network element 970. This may be coaxial cable coupled to the first channel 150$a$, or it may be a collection of network elements conventional to the practice of network testing and measuring. Similarly, connector 915 is coupled to the instrument 110 by way of network element 975, which is coupled to the second channel 150$b$.

In an embodiment, networks [N8] and [N9] are interconnected across an unsupported interface utilizing bullets. Networks [N8] and [N9] are individually measured and characterized to generate virtual network models, that when mathematically cascaded, provide the correct total system response [NT3]:

[NT3]=[N8]:[B]:[N9]—Cascaded Network [NT3] with Bullet [B] where the individual Network components to be characterized are as follows:

[N8]—Network [N8]

[N9]—Network [N9]

[B]—Bullet

:—Unsupported connecter interface

Calibrated measurements of each augmented Network:

[M7]=[N8]:[B]:[A7]

[M8]=[A8]:[B]:[N9]

Calibrated measurements of Back-to-Back Adapter-Pair:

[M9]=[A8]:[B]:[A7]

generating the Deembedding Network $[M9]^{-1}$=$[[A8]:[B]:[A7]]^{-1}$=$[A7]^{-1}[B]^{-1}[A8]^{-1}$ Applying the Deembedding Network to the Augmented Networks yields the following:

$$[M7]:[M9]^{-1}:[M8] = [N8]:[B]:[A7]\ [A7]^{-1}[B]^{-1}[A8]^{-1}\ [A8]:[B]:[N9]$$

$$= [N8]:[B]:[N9]$$

$$= [NT3]$$

Virtual network model partitioning may include absorbing the inverse adapter-pair measurement $[M9]^{-1}$ into [M8]:

[N8]:[B]:[N9]=[M7] $[M9]^{-1}$ [M8]

[N8]:[B]:[N9]=[N8]:[B]:[A7] $[A7]^{-1}[B]^{-1}[A8]^{-1}$ [A8]:[B]:[N9]

[N8]:[B]:[N9]=[N8]:[B]:[A7] [A7]$^{-1}$ [N9]
[N8]:[B]:[N9]=[VN9] [VN10]
The following definitions may be derived from the above:
[VN9]=[M7]=[N8]:[B]:[A7]
[VN10]=[M9]$^{-1}$[M8]=[A7]$^{-1}$[N9]
As can be seen, virtual model [VN9] is equal to measurement [M7]. In addition, virtual model [VN10] is equal to measurement [M9]$^{-1}$ cascaded with measurement [M8]. These derivations may be verified with the following:
[VN9]:[VN10]=[N8]:[B]:[A7] [A7]$^{-1}$[N9]
[VN9]:[VN10]=[N8]:[B]:[N9]
[VN9]:[VN10]=[NT3]

Having described and illustrated the principles of the invention with reference to illustrated embodiments, it will be recognized that the illustrated embodiments may be modified in arrangement and detail without departing from such principles, and may be combined in any desired manner. And although the foregoing discussion has focused on particular embodiments, other configurations are contemplated. In particular, even though expressions such as "according to an embodiment of the invention" or the like are used herein, these phrases are meant to generally reference embodiment possibilities, and are not intended to limit the invention to particular embodiment configurations. As used herein, these terms may reference the same or different embodiments that are combinable into other embodiments.

Consequently, in view of the wide variety of permutations to the embodiments described herein, this detailed description and accompanying material is intended to be illustrative only, and should not be taken as limiting the scope of the invention. What is claimed as the invention, therefore, is all such modifications as may come within the scope and spirit of the following claims and equivalents thereto.

The invention claimed is:

1. An apparatus for characterizing a total network [TN] using a signal measurement instrument, comprising:
   the signal measurement instrument connected to the total network [TN], the total network [TN] having a first individual multiport network [N1] and a second individual multiport network [N2];
   the first individual multiport network [N1] and the second individual multiport network [N2] cascaded and interconnected by an unsupported connector where ':' denotes the unsupported connector interface and [TN]=[N1]:[N2];
   a first adapter [A1] added to the first individual multiport network [N1];
   a first augmented network [M1] where [M1]=[N1]:[A1];
   a second adapter [A2] added to the second individual multiport network [N2];
   a second augmented network [M2] where [M2]=[A2]:[N2].

2. The apparatus of claim 1, wherein the first and second augmented networks [M1] and [M2] allow for calibrated measurements.

3. The apparatus of claim 2, wherein the calibrated measurements include measurements that can be traced to known standards.

4. The apparatus of claim 1, wherein the unsupported connector is of a connector type that does not allow for calibrated measurements.

5. The apparatus of claim 1, wherein the unsupported connector interface ':' represents a connector type that does not have support for measurements made to known, traceable standards.

6. The apparatus of claim 1, wherein any of the characterizations may be represented by time domain or frequency domain calibrated measurements.

7. The apparatus of claim 1, wherein any of the characterizations may be represented by mathematical models.

8. The apparatus of claim 1, comprising: generating first and second virtual network models [VN1] and [VN2] by cascading a de-embed network [DN] with one of the first and second augmented networks [M1] and [M2] such that [VN1]=[N1][A1]=[M1][VN2]=[DN].sup.-1 [A2][N2]=[M3].sup.-1 [M2].

9. The apparatus of claim 8, further comprising generating the total network [TN] by: cascading the sum of the first and second virtual network models [VN1] and [VN2] such that [TN]=[VN1][VN2]=[M1][M3].sup.-1[M2]; substituting such that [TN]=[VN1][VN2]=[N1][A1][A1].sup.-1 [A2].sup.-1 [A2][N2]; and canceling terms such that [TN]=[VN1][VN2]=[N1][N2].

10. The apparatus of claim 9, wherein the sum of the cascaded virtual network models [VN1] and [VN2] is equal to the sum of the cascaded individual multiport networks [N1] and [N2] and the total network [TN].

11. An apparatus for characterizing a total network [TN] using a signal measurement instrument, comprising:
   the signal measurement instrument connected to the total network [TN], the total network [TN] having a first individual multiport network [N1] and a second individual multiport network [N2];
   an augmented network that employs matrix math using "[" and "]" such that "[N1][N2]" denotes a cascading/embedding of the first individual multiport network [N1] and the second individual multiport network [N2]; and
   a deembedding network that employs matrix math using "[" and "].sup.-1" such that "[N3][N1].sup.-1" denotes a de-embedding of the first individual multiport network [N1] from a third individual multiport network [N3].

12. The apparatus of claim 11, wherein the first and second individual multiport networks [N1] and [N2] are described using ABCD parameter matrices.

13. The apparatus of claim 12, wherein "[N1] [N2]" is accomplished directly by matrix multiplication of [N1] and [N2].

14. The apparatus of claim 11, wherein the first and second individual multiport networks [N1] and [N2] are described using s-parameter matrices.

15. The apparatus of claim 14, further comprising: transforming [N1] and [N2] to t-parameter matrices; performing a matrix multiplication of the t-parameter matrices; and transforming the results of the matrix multiplication to s-parameters.

16. The apparatus of claim 11, wherein the first and second individual multiport networks [N1] and [N2] describe a de-embedding process [N1][N2].sup.-1 using s-parameter matrices.

17. The apparatus of claim 16, further comprising: transforming [N1] and [N2] to t-parameter matrices [T1] and [T2], respectively; performing the matrix operations on the [T1] and [T2] matrices ([T1][T2].sup.-1); and transforming the results to s-parameters.

18. The apparatus of claim 16, further comprising: assembling a physical de-embed network [M3] from the first and second adapters [A1] and [A2]; and measuring [M3] by defining [M3]=[A2][A1], thus [M3].sup.-1=[A1].sup.-1 [A2].sup.-1=[DN].sup.-1.

19. An apparatus for characterizing a total network [TN] using a signal measurement instrument, comprising:
the signal measurement instrument connected to the total network [TN], the total network [TN] having a first individual multiport network [N1] and a second individual multiport network [N2];
a first adapter [A1] added to the first individual multiport network [N1];
a second adapter [A2] added to the second individual multiport network [N2];
two augmented networks [M1] and [M2] such that [M1] [M2]=[N1]:[A1] [A2]:[N2] where [N1] and [N2] denote the first and second individual networks, respectively, [A1] and [A2] denote the first and second adapters, respectively, and denotes an unsupported connector interface; and
a de-embed network [DN] inserted between the two augmented networks [M1] and [M2] where [DN].sup.-1=[[A2][A1]].sup.-1, thus [DN]=[A2][A1], such that: [N1]:[A1] [DN].sup.-1 [A2]:[N2], thus [N1]:[A1] [[A2][A1]].sup.-1 [A2]:[N2], thus [N1]: [A1] [A1] .sup.-1 [A2].sup.-1 [A2]:[N2], thus [N1]::[N2].

\* \* \* \* \*